United States Patent
Yu et al.

(10) Patent No.: US 11,060,188 B2
(45) Date of Patent: *Jul. 13, 2021

(54) SELECTIVE DEPOSITION OF ALUMINUM OXIDE ON METAL SURFACES

(71) Applicant: Applied Materials, Inc., Santa Clara, CA (US)

(72) Inventors: Sang Ho Yu, Cupertino, CA (US); Seshadri Ganguli, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 167 days.

This patent is subject to a terminal disclaimer.

(21) Appl. No.: 16/515,585

(22) Filed: Jul. 18, 2019

(65) Prior Publication Data

US 2019/0338417 A1  Nov. 7, 2019

Related U.S. Application Data

(63) Continuation of application No. 15/814,863, filed on Nov. 16, 2017, now Pat. No. 10,358,719.

(Continued)

(51) Int. Cl.
*C23C 16/40* (2006.01)
*C23C 16/455* (2006.01)
(Continued)

(52) U.S. Cl.
CPC ...... *C23C 16/403* (2013.01); *C23C 16/45525* (2013.01); *C23C 16/45527* (2013.01);
(Continued)

(58) Field of Classification Search
CPC ............ C23C 16/403; C23C 16/45525; C23C 16/45527; C23C 16/45544
See application file for complete search history.

(56) References Cited

U.S. PATENT DOCUMENTS

| | | | |
|---|---|---|---|
| 5,614,247 A | 3/1997 | Barbee et al. | |
| 8,747,964 B2 | 6/2014 | Park et al. | |

(Continued)

FOREIGN PATENT DOCUMENTS

| | | |
|---|---|---|
| KR | 20130015091 A | 2/2013 |
| KR | 101465114 B1 | 12/2014 |

OTHER PUBLICATIONS

Zywotko, David R., et al., "ZrO2 Monolayer as a Removable Etch Stop Layer for Thermal Al2O3 Atomic Layer Etching Using Hydrogen Fluoride and Trimethylaluminum". Chemistry of Materials, 2020, 32, 10055-10065.*

(Continued)

*Primary Examiner* — Bret P Chen
(74) *Attorney, Agent, or Firm* — Servilla Whitney LLC

(57) ABSTRACT

Processing methods for depositing aluminum etch stop layers comprise positioning a substrate within a processing chamber, wherein the substrate comprises a metal surface and a dielectric surface; exposing the substrate to an aluminum precursor gas comprising an isopropoxide based aluminum precursor to selectively form an aluminum oxide (AlOx) etch stop layer onto the metal surface while leaving exposed the dielectric surface during a chemical vapor deposition process. The metal surfaces may be copper, cobalt, or tungsten.

13 Claims, 6 Drawing Sheets

Related U.S. Application Data

(60) Provisional application No. 62/426,030, filed on Nov. 23, 2016.

(51) Int. Cl.
    *H01J 37/26*           (2006.01)
    *C01F 7/02*            (2006.01)

(52) U.S. Cl.
    CPC .......... *C23C 16/45544* (2013.01); *C01F 7/02* (2013.01); *H01J 37/26* (2013.01)

(56) References Cited

U.S. PATENT DOCUMENTS

| | | | |
|---|---|---|---|
| 9,129,798 | B1 | 9/2015 | Zhu |
| 9,663,896 | B2 * | 5/2017 | Rosengren ......... D21C 11/0007 |
| 9,859,153 | B1 * | 1/2018 | Rainville ................ C23C 22/05 |
| 10,109,520 | B2 * | 10/2018 | Kesapragada .... H01L 21/02126 |
| 10,358,719 | B2 * | 7/2019 | Yu ..................... C23C 16/45527 |
| 2007/0259534 | A1 | 11/2007 | Reid et al. |
| 2009/0047790 | A1 * | 2/2009 | Raghu ............... H01L 21/31144 |
| | | | 438/703 |
| 2014/0017414 | A1 | 1/2014 | Fukazawa et al. |
| 2015/0221596 | A1 | 8/2015 | Ren |
| 2015/0243709 | A1 | 8/2015 | Song et al. |
| 2015/0299848 | A1 | 10/2015 | Haukka et al. |
| 2016/0111325 | A1 * | 4/2016 | JangJian .......... H01L 21/76877 |
| | | | 257/774 |
| 2016/0240483 | A1 | 8/2016 | Chen |
| 2017/0098575 | A1 * | 4/2017 | Kesapragada ...... H01L 21/3105 |

OTHER PUBLICATIONS

Hashemi, Fatemeh S. M., et al., "Aluminum tri-isopropoxide as an alternative precursor for atomic layer deposition of aluminum oxide thin films". Journal of Vacuum Science & Technology A 37, 040901 pp. 1-9 (2019). https://doi.org/10.1116/1.5093402.*

Hennessy, John, et al., "Enhanced atomic layer etching of native aluminum oxide for ultraviolet optical applications". Journal of Vacuum Science & Technology A 35, 041512 pp. 1-9 (2017). https://doi.org/10.1116/1.4986945.*

Schmidt, Benjamin W., et al., "Metal-organic chemical vapor deposition of aluminum oxide thin films via pyrolysis of dimethylaluminum isopropoxide". Journal of Vacuum Science & Technology A 28 (2), 238-243 (2010). https://doi.org/10.1116/1.3294718.*

Winterkorn, Martin, M., et al., "Atomic Layer Deposited Etch Stop Layers for Hydrofluoric Acid". Conference paper from Solid-State Sensors, Actuators, and Microsystems Workshop, Hilton Head Island, SC, Jun. 5-9, 2016, pp. 133-136.*

Hanyu, Isamu, et al., "Al2O3 etchstop layer for a phase-shifting mask". Proc. SPIE 1463, Optical/Laser Microlithography IV, (Jul. 1, 1991) pp. 595-601, doi: 10.1117/12.44833.*

Seo, Seunggi, et al., "Reaction Mechanism of Area-Selective Atomic Layer Deposition for Al2O3 Nanopatterns". Applied Materials & Interfaces, 2017, 9, 41607-41617.*

Masu, Kazuya, et al., "Selective deposition of aluminum from selectively excited metalorganic source by the rf plasma". Applied Physics Letters, 56, 1543 (1990), 2 pages. Abstract Only.*

PCT International Search Report and Written Opinion in PCT/US2017/062160 dated Mar. 13, 2018, 9 pages.

Aboaf, J. A., "Deposition and Properties of Aluminum Oxide Obtained by Pyrolytic Decomposition of an Aluminum Alkoxide", J. Electrochem. Soc. vol. 114, No. 9, 1967, 948-952.

Potts, Stephen E., "Plasma-enhanced and thermal atomic layer deposition of Al2O3 using dimethylaluminum isopropoxide, [Al(CH3)2(u-OiPr]2, as an alternative aluminum precursor", J. Vac. Sci. Technol. A30(2), 2012, 13 pgs.

Ritala, Mikko, et al., "Atomic Layer Deposition of Oxide Thin Films with Metal Alkoxides as Oxygen Sources", Science vol. 288, Apr. 14, 2000, 319-321.

Schmidt, Benjamin W., et al., "Metal-organic chemical vapor deposition of aluminum oxide thin films via pyrolysis of dimenthylaluminum isopropoxide", J. Vac. Sci. Technol. A 28(2), 2010, 238-244.

* cited by examiner

SELECTIVE DEPOSITION OF ALUMINUM OXIDE ON METAL SURFACES

CROSS-REFERENCE TO RELATED APPLICATIONS

This application is a continuation of U.S. patent application Ser. No. 15/814,863, filed Nov. 16, 2017, now U.S. Pat. No. 10,358,719 issued on Jul. 23, 2019, which claims priority to U.S. Provisional Application No. 62/426,030, filed Nov. 23, 2016, the entire disclosures of which are hereby incorporated by reference herein.

TECHNICAL FIELD

The present disclosure relates generally to methods of depositing thin films. In particular, the disclosure relates to methods of selectively depositing aluminum oxide layers as etch stop layers on metal surfaces.

BACKGROUND

Integrated circuits are made possible by processes that produce intricately patterned material layers on substrate surfaces. Producing patterned material on a substrate requires controlled methods for both deposition of desired materials and removal of exposed material. Selectively depositing a film on one surface relative to a different surface is useful for patterning and other applications.

During etch steps to preferentially remove dielectric material, metal surfaces are protected with an etch stop layer. Further oxidation of the metal surfaces is to be minimized. An exemplary etch stop layer is aluminum oxide (AlOx). Previous processes rely on physical vapor deposition (PVD) of AlOx.

Node sizes continue to decrease, e.g., from 10 nm to 5-7 nm.

There is a continuing need for methods that efficiently and effectively deposit AlOx as etch layers as node sizes decrease.

SUMMARY

One or more embodiments of the disclosure are directed to processing methods comprising positioning a substrate within a processing chamber, the substrate comprising a metal surface and a dielectric surface. The substrate is exposed to an aluminum precursor gas comprising an isopropoxide based aluminum precursor and a non-oxidizing reactant to form an aluminum oxide (AlOx) etch stop layer on the metal surface.

Additional embodiments of the disclosure are directed to processing methods comprising positioning a substrate within a processing chamber, wherein the substrate comprises a metal surface and a dielectric surface. The substrate is exposed to a first process condition comprising an aluminum precursor gas comprising an isopropoxide based aluminum precursor. The substrate is exposed to a second process condition comprising a reactant to selectively form an aluminum oxide (AlOx) etch stop layer onto the metal surface while leaving exposed the dielectric surface. Exposure to the first process condition and the second process condition is optionally repeated to form a desired thickness of the AlOx etch stop layer.

Further embodiments of the disclosure are directed to processing methods comprising positioning a substrate within a processing chamber, wherein the substrate comprises a copper or tungsten surface and a dielectric surface. The substrate is exposed to an aluminum precursor gas comprising dimethyl aluminum isopropoxide and to a reactant comprising an alcohol to selectively form an aluminum oxide (AlOx) etch stop layer having a selectivity of at least about 5:1 onto the copper or tungsten surface. The dielectric surface is left exposed. A chemical vapor deposition process is used wherein a temperature of the substrate is 400° C. or less.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
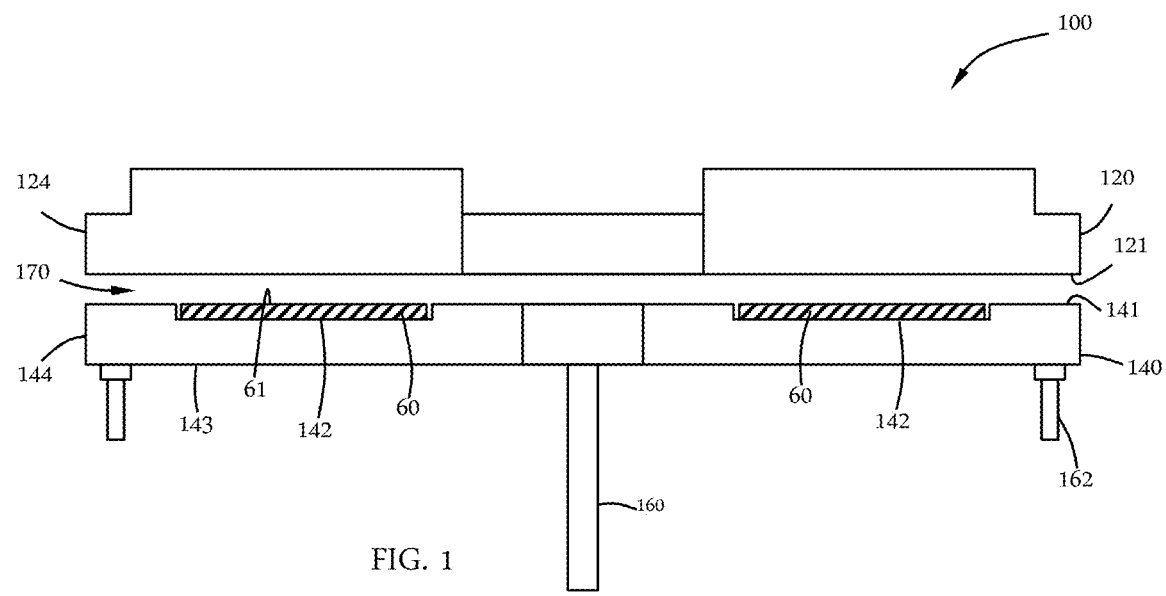
FIG. 1 shows a cross-sectional view of a batch processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

Embodiments of the disclosure provide methods to deposit aluminum oxide layers onto metal surfaces such as copper or cobalt or tungsten in the presence of low-k dielectric material. An organic aluminum-containing precursor is used, preferably an isopropoxide based aluminum precursor. Methods of deposition may include: thermal decomposition, PECVD, and ALD. With thermal decomposition, temperature of the substrate is >450° C.; no oxidation of metal surface without any selectivity relative to dielectric surfaces. With PECVD, the temperature of the substrate is >200° C.; very minimal oxidation of metal with no selectivity relative to dielectric surfaces. With ALD in the presence of oxygen at <300° C., selective deposition of film is obtained, but oxidation of metal surface may be expected. With ALD in the presence of alcohol at <400° C., there is selectivity and minimal oxidation of metal (Cu, W, and Co).

Upon use of an organic aluminum precursor, a carbon impurity may be present. Advantages of the deposited AlOx film with carbon as impurity include having etch selectivity between the film and low-K dielectric material used in back end metallization. Another advantage is minimal damage of the low-k material and change of its properties and barrier properties to oxidation, moisture and Cu diffusion. The deposition process also minimizes or eliminates the oxidation of the underlying metal film.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOl), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure provide processing methods to provide aluminum oxide etch stop layers. As used in this specification and the appended claims, the terms "selective deposition of" and "selectively forming" a film on one surface over another surface, and the like, means that a first amount of the film is deposited on the first surface and a second amount of film is deposited on the second surface, where the second amount of film is less than the first amount of film or none. The term "over" used in this regard does not imply a physical orientation of one surface on top of another surface, rather a relationship of the thermodynamic or kinetic properties of the chemical reaction with one surface relative to the other surface. For example, selectively depositing an aluminum oxide layer onto a metal surface over a dielectric surface means that the aluminum oxide deposits on the meal surface and less aluminum oxide deposits on the dielectric surface; or that the formation of the aluminum oxide on the meal surface is thermodynamically or kinetically favorable relative to the formation of aluminum oxide on the dielectric surface. Stated differently, the film can be selectively deposited onto a first surface relative to a second surface means that deposition on the first surface is favorable relative to the deposition on the second surface.

According to one or more embodiments, the method uses a chemical vapor deposition (CVD) process. In such embodiments, the substrate surface is exposed to a first reactive gas and a second reactive gas at the same time so that the first reactive gas and the second reactive gas mix during formation of the film.

According to one or more embodiments, the method uses an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reactant, although there may be some overlap. As used in this specification and the appended claims, the terms "precursor", "reactant", "reactive gas" and the like are used interchangeably to refer to any gaseous species that can react with the substrate surface, or a species present on the substrate surface.

In one or more embodiments, the method is performed using an Atomic Layer Deposition (ALD) process. An ALD process is a self-limiting process where a single layer of material is deposited using a binary (or higher order) reaction. An individual ALD reaction is theoretically self-limiting continuing until all available active sites on the substrate surface have been reacted. ALD processes can be performed by time-domain or spatial ALD.

In a time-domain process, the processing chamber and substrate are exposed to a single reactive gas at any given time. In an exemplary time-domain process, the processing chamber might be filled with a metal precursor for a time to allow the metal precursor to fully react with the available sites on the substrate. The processing chamber can then be purged of the precursor before flowing a second reactive gas into the processing chamber and allowing the second reactive gas to fully react with the substrate surface or material on the substrate surface. The time-domain process minimizes the mixing of reactive gases by ensuring that only one reactive gas is present in the processing chamber at any given time. At the beginning of any reactive gas exposure, there is a delay in which the concentration of the reactive species goes from zero to the final predetermined pressure. Similarly, there is a delay in purging all of the reactive species from the process chamber.

In a spatial ALD process, the substrate is moved between different process regions within a single processing chamber. Each of the individual process regions is separated from adjacent process regions by a gas curtain. The gas curtain helps prevent mixing of the reactive gases to minimize any gas phase reactions. Movement of the substrate through the different process regions allows the substrate to be sequentially exposed to the different reactive gases while preventing gas phase reactions.

Some embodiments of the disclosure are directed to film deposition processes using a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s).

Figure 2:
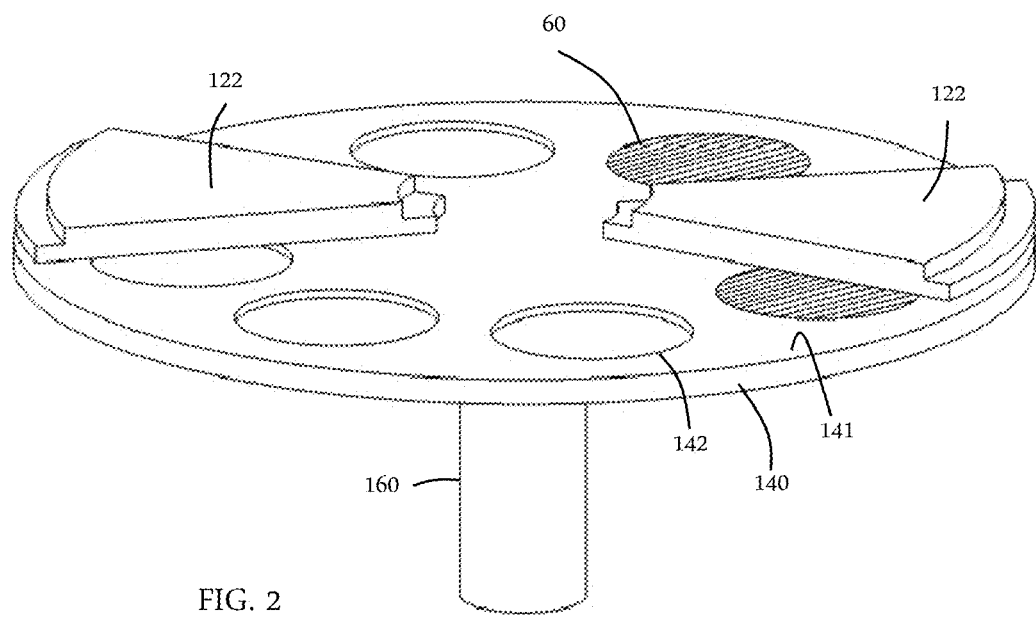
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, 0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
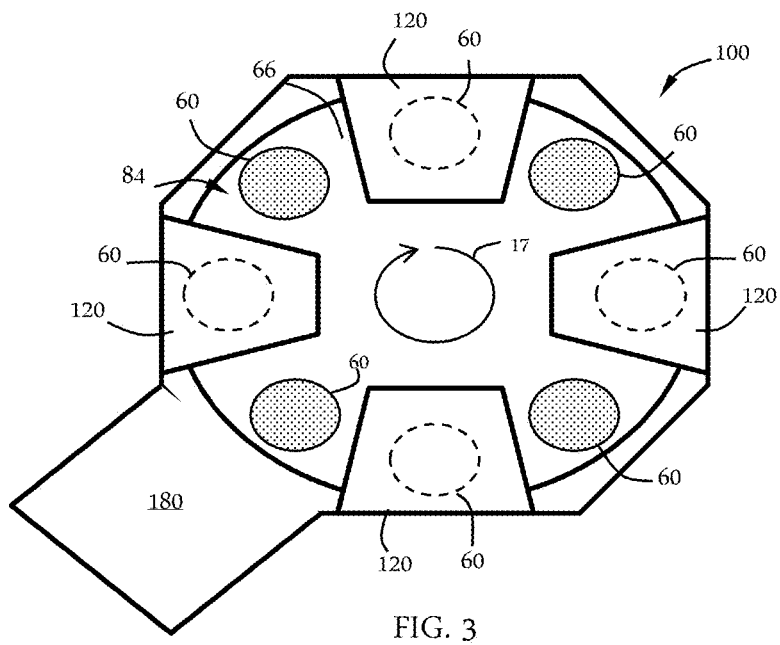
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one. In an exemplary embodiment, the gas distribution assembly 120 includes eight processing regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This load lock chamber 180 is connected to a side of the processing chamber 100 to allow, for example the substrates (also referred to as substrates 60) to be loaded/unloaded from the processing chamber 100. A wafer robot may be positioned in the load lock chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing between each layer deposition (e.g., exposure to plasma).

Figure 4:
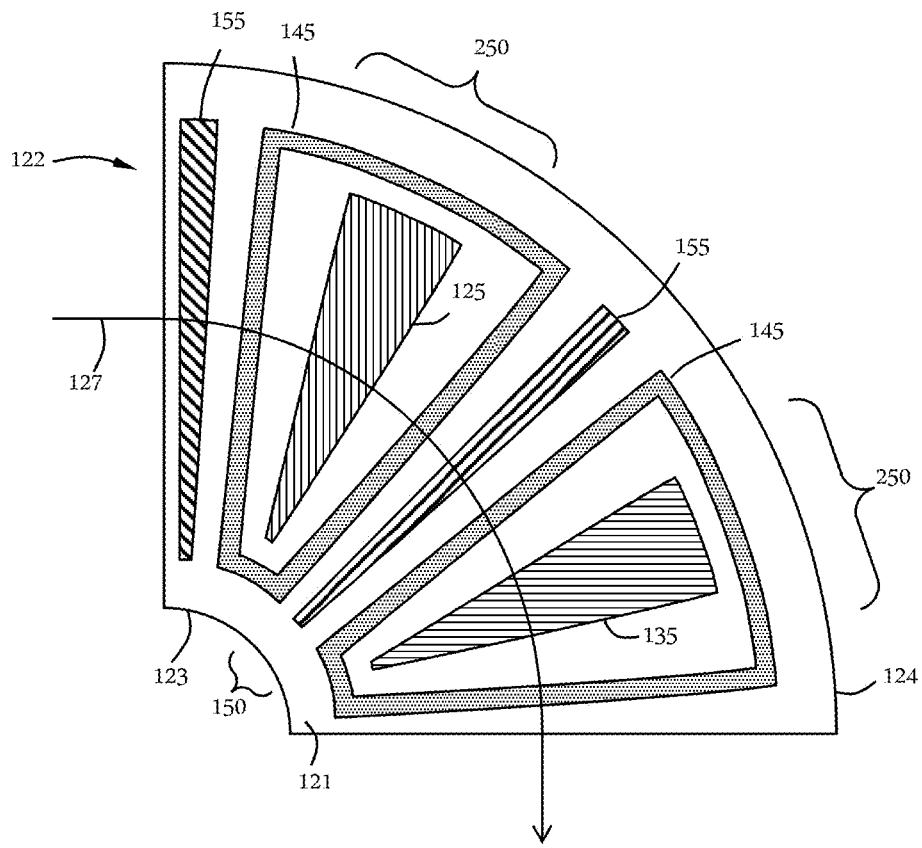
FIG. 4 shows a schematic view of a portion of a wedge shaped gas distribution assembly for use in a batch processing chamber in accordance with one or more embodiment of the disclosure.
Figure 5:
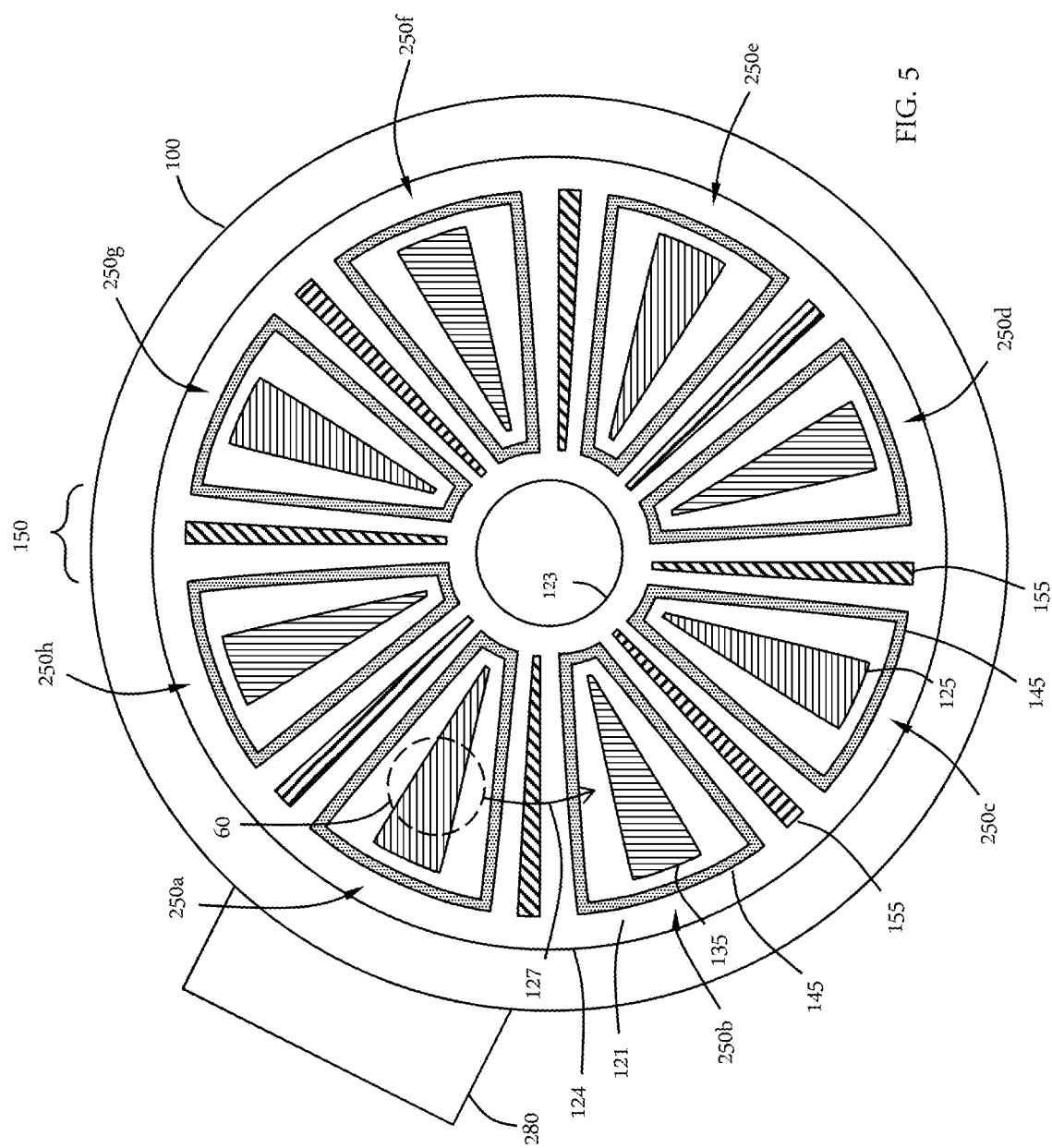
FIG. 5 shows a schematic view of a batch processing chamber in accordance with one or more embodiments of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and elongate vacuum ports 145 in a front surface 121 of the gas distribution assembly 220. The plurality of elongate gas ports 125, 135, 155 and elongate vacuum ports 145 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first gas port 125 and the second gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120. The substrate is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counterclockwise around the processing chamber 100. Thus, the substrate 60 will be exposed to the first processing region 250a through the eighth processing region 250h, including all processing regions between.

Embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250b through processing region 250h, an inert gas would be flowing into processing region 250a. The inert gas can be flowed through the first reactive gas port 125 or the second gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

Figure 6:
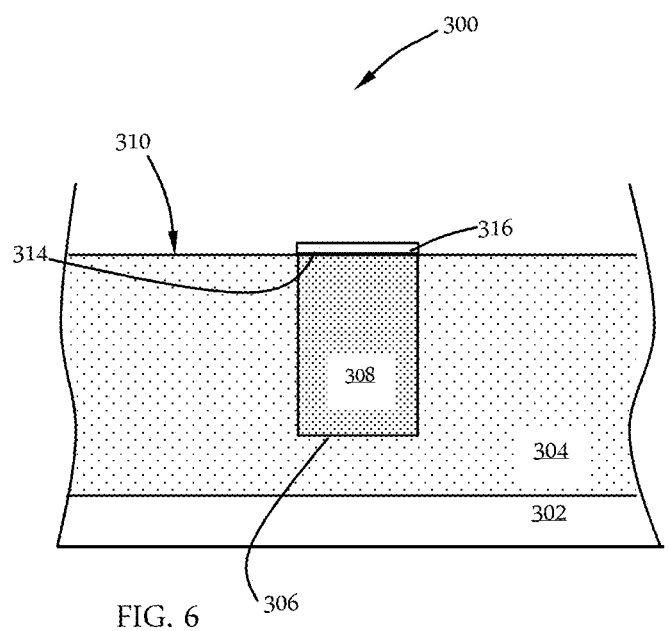
FIG. 6 shows a schematic cross-sectional view of a substrate with an AlOx etch stop layer deposited on a metal surface in accordance with one or more embodiments of the disclosure.

FIG. 6 is a schematic cross-sectional view of a substrate with an AlOx etch stop layer deposited on a metal surface (e.g., tungsten) in accordance with one or more embodiments of the disclosure. A substrate 300 containing dielectric layer 304 disposed over underlayer 302 comprises a metal surface 314 of an interconnect 308 and a dielectric surface 310. The substrate 300 is provided in a chemical vapor deposition chamber for processing. As used in this regard, the term "provided" means that the substrate is placed into a position or environment for further processing. In this embodiment, the interconnect may be tungsten, which provides a tungsten surface. The AlOx etch stop layer 316 is selectively deposited onto the metal surface 314 over the dielectric surface 310. In one or more embodiments, the selectivity may be at least about 5:1 or in the range of about 5:1 to about 20:1 or at least about 20:1.

Interconnects 308 are disposed within dielectric layer 304 and are separated from dielectric layer 304 by barrier layer 306. Dielectric layer 304 contains a dielectric material, such as a low-k dielectric material. In one example, dielectric layer 304 contains a low-k dielectric material, such as a silicon carbide oxide material or a carbon doped silicon oxide material, for example, BLACK DIAMOND® II low-k dielectric material, available from Applied Materials, Inc., located in Santa Clara, Calif.

Barrier layer 306 may be conformally deposited into the aperture within dielectric layer 304. Barrier layer 306 may be formed or deposited by a PVD process, an ALD, or a CVD process, and may have a thickness within a range from about 5 Å to about 50 Å, preferably, from about 10 Å to about 30 Å. Barrier layer 306 may contain titanium, titanium nitride, tantalum, tantalum nitride, tungsten, tungsten nitride, derivatives thereof, or combinations thereof. In some embodiments, barrier layer 306 may contain a tantalum/tantalum nitride bilayer or titanium/titanium nitride bilayer.

Figure 7:
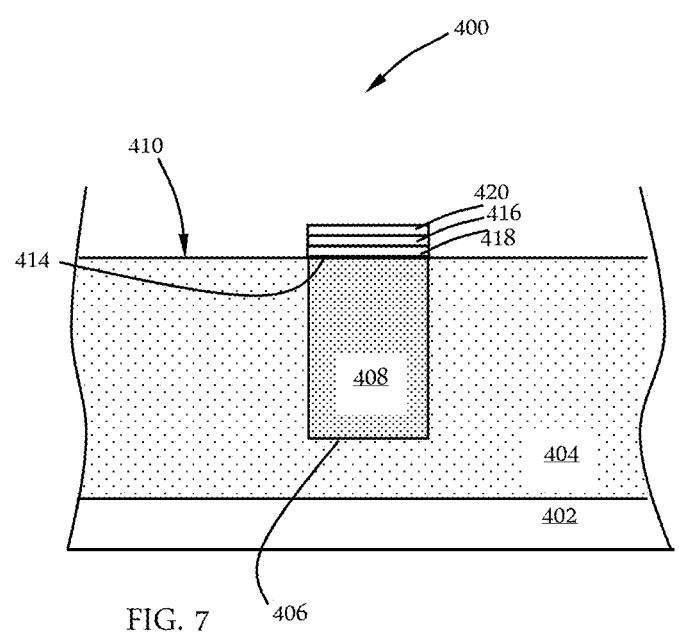
FIG. 7 shows a schematic cross-sectional view of a substrate with an AlOx etch stop layer deposited on a metal surface with other optional layers in accordance with one or more embodiments of the disclosure.

FIG. 7 is a schematic cross-sectional view of a substrate with an AlOx etch stop layer deposited on a metal surface with other optional layers in accordance with one or more embodiments of the disclosure. A substrate 400 containing dielectric layer 404 disposed over underlayer 402 comprises a metal surface 414 of an interconnect 408 and a dielectric surface 410. The substrate is provided in a chemical vapor deposition chamber for processing. In this embodiment, the interconnect may be copper, which provides a copper surface. The metal surface 414 may have a selectively formed capping layer 418, which comprises cobalt. The AlOx etch stop layer 416 is selectively deposited onto the metal surface 414 including the capping layer 418 over the dielectric surface 410. In one or more embodiments, the selectivity may be at least about 5:1 or in the range of about 5:1 to about 20:1 or at least about 20:1.

Optional SiOC layer may be formed onto the AlOx etch stop layer in further processing.

Interconnects 408 are disposed within dielectric layer 404 and are separated from dielectric layer 404 by barrier layer 406. Dielectric layer 404 like dielectric layer 304 discussed above contains a dielectric material, such as a low-k dielectric material. In one example, dielectric layer 404 contains a low-k dielectric material, such as a silicon carbide oxide material or a carbon doped silicon oxide material, for example, BLACK DIAMOND® II low-k dielectric material, available from Applied Materials, Inc., located in Santa Clara, Calif.

Barrier layer 406 may be conformally deposited into the aperture within dielectric layer 404. Barrier layer 406 may be formed or deposited by a PVD process, an ALD, or a CVD process, and may have a thickness within a range from about 5 Å to about 50 Å, preferably, from about 10 Å to about 30 Å. Barrier layer 306 may contain titanium, titanium nitride, tantalum, tantalum nitride, tungsten, tungsten nitride, derivatives thereof, or combinations thereof. In some embodiments, barrier layer 406 may contain a tantalum/tantalum nitride bilayer or titanium/titanium nitride bilayer.

Figure 8:
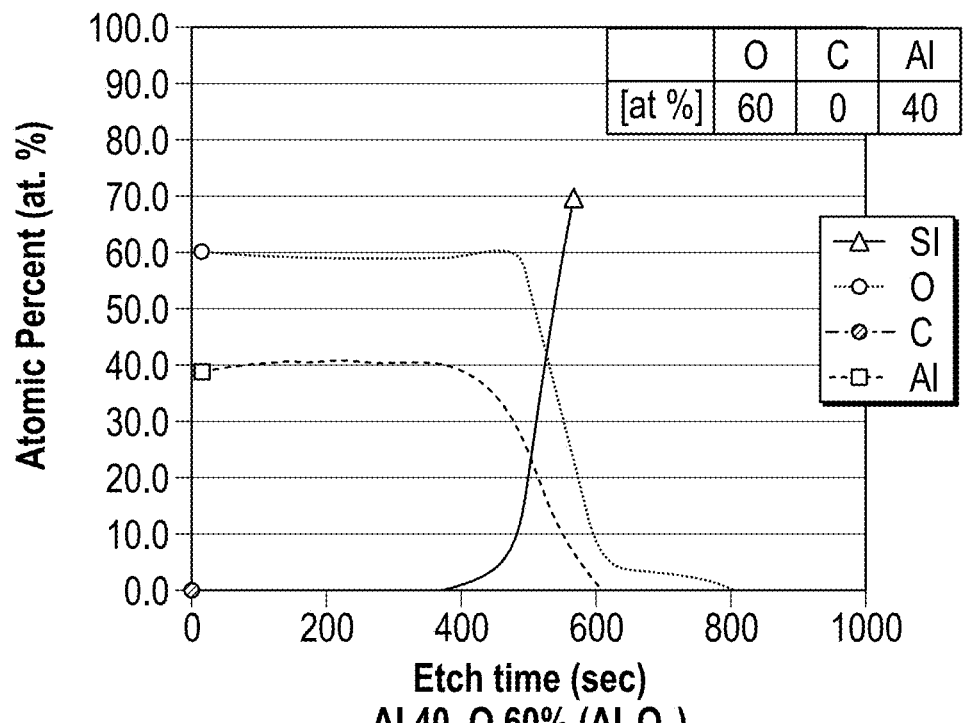
FIG. 8 is a graph of atomic % versus etch time for AlOx film selectively formed on copper.

In some embodiments, as shown in FIGS. 7-8, the metal surface and the dielectric surface are substantially coplanar. Those skilled in the art will understand that substantially coplanar means that the major planes formed by individual surface are within about the same plane. As used in this regard, "substantially coplanar" means that the plane formed by the first surface is within ±100 µm of the plane formed by the second surface, measured at the boundary between the first surface and the second surface. In some embodiments, the planes formed by the first surface and the second surface are within ±500 µm, ±400 µm, ±300 µm, ±200 µm, ±100 µm, ±50 µm, ±10 µm, ±5 µm, ±1 µm, ±500 nm, ±250 nm, ±100 nm, ±50 nm, ±10 nm, ±1 nm or ±0.1 nm.

The AlOx layer formed can be any suitable film. In some embodiments, the film formed is an amorphous or crystalline aluminum-containing film comprising one or more species according to $AlO_x$, where the formula is representative of the atomic composition, not stoichiometric. The film can be formed by any suitable process including, but not limited to, chemical vapor deposition (CVD), plasma-enhanced chemical vapor deposition (PECVD), atomic layer deposition (ALD), and plasma-enhanced atomic layer deposition (PEALD). Precursors of aluminum may be isopropoxide-based precursors. For example, the aluminum precursor may comprise dimethyl aluminum isopropoxide. The precursor may be heated in a hot can to increase the vapor pressure and be delivered to the chamber using a carrier gas (e.g., ultrahigh purity (UHP) Ar, He, $H_2$, N2, etc.).

The reactant may comprise an oxygen source. The reactant may be selected from the group consisting of: $O_2$, $O_2$ plasma, $H_2O$, $H_2O$ plasma, $D_2O$, $O_3$, methanol, ethanol, isopropanol. Preferably, the reactant is non-oxidizing. As used herein, a non-oxidizing reactant is one that does not donate oxygen to the metal surface. Preferred non-oxidizing reactants are: alcohols such as methanol, ethanol, and/or isopropanol and ketones such as methyl isobutyl ketone (MIBK).

In some embodiments, the AlOx etch stop layer 316 or 416 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film. The etch stop layer may have a carbon impurity present. Carbon content may be less than about 10% or 5% or 1% or 0.5% or 0.1% carbon on an atomic basis in the film.

The temperature of the substrate during deposition can be any suitable temperature depending on, for example, the precursor(s) being used. In some embodiments, the deposition temperature is in the range of about 50° C. to less than 400° C., or in the range of about 200° C. to about 390° C., or in the range of about 250° C. to about 280° C. The deposition can occur with or without plasma. For a PECVD process, plasma may be used with alumina precursor and no reactant gases in the presence of noble gases. For ALD or thermal deposition process there generally is no plasma. For processes using plasma, the plasma can be a capacitively-coupled plasma (CCP) or inductively coupled plasma (ICP) or microwaves and can be a direct plasma or a remote plasma. Plasma power for CCP plasma may be in the range of 20 to 400 W. The processing chamber pressure during deposition can be in the range of about 50 mTorr to 750 Torr, or in the range of about 100 mTorr to about 400 Torr, or in the range of about 1 Torr to about 100 Torr, or in the range of about 2 Torr to about 10 Torr. Post deposition, plasma treatment with Ar or Ar/$O_2$ mixture may be done to improve film property such as film density.

According to one or more embodiments, the substrate is subjected to processing prior to and/or after forming the etch stop layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge all of the excess reagent out of the chamber before flowing in additional regent. Therefore, any leftover reagent in the chamber may react. With spatial separation, excess reagent does not need to be purged, and cross-contamination is limited. Furthermore, a lot of time can be taken to purge a chamber, and therefore throughput can be increased by eliminating the purge step.

EXAMPLES

Example 1

AlOx layer was selectively deposited onto a copper surface in the presence of TiN and SiO$_2$ dielectric surfaces by an ALD process using dimethyl aluminum isopropoxide and oxygen at a substrate temperature of below 300° C. The results are in Table 1, showing layer thickness relative to # of cycles.

TABLE 1

| Surface | 10 cycles | 30 cycles | 50 cycles | 100 cycles |
|---|---|---|---|---|
| TiN | 0 None detected | 0 None detected | 0 None detected | 0 None detected |
| Cu | 135 Å | 190 Å | 250 Å | 290 Å |
| SiO$_2$ | 0 None detected | 10 Å | 20 Å | 42 Å |
| Selectivity Cu:SiO$_2$ | ∞ | 19 | 12.5 | 6.9 |

FIG. 8 is a graph of atomic % versus etch time for the AlOx layer selectively formed on copper, where there is no carbon present in the layer.

Example 2

Figure 9:
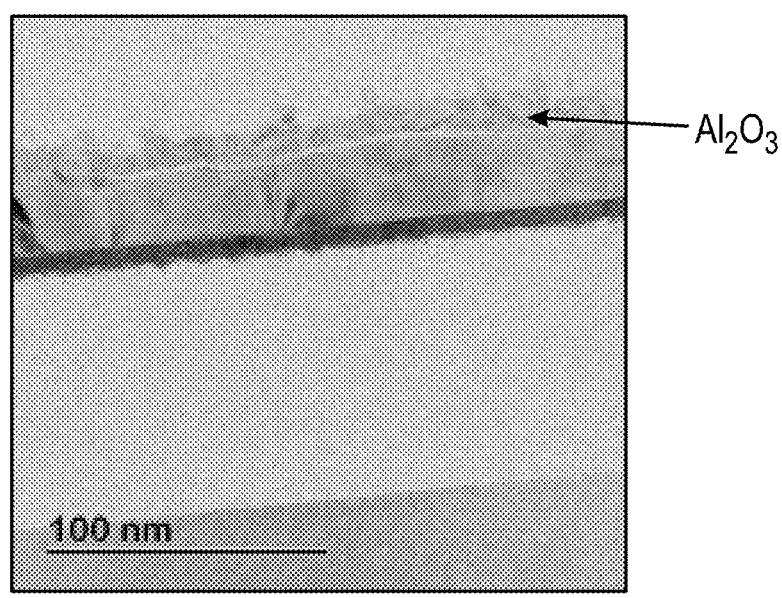
FIG. 9 is a Transmission Electron Microscope (TEM) image of a dielectric surface after formation of $Al_2O_3$ film on a copper surface.

AlOx layer was selectively deposited onto a copper surface (located on Ta and Si) in the presence of a SiO$_2$ dielectric surface by an ALD process using dimethyl aluminum isopropoxide and ethyl alcohol at a substrate temperature of 250° C. The ALD process includes: 50 cycles, 5 torr chamber pressure, 5 seconds precursor/10 seconds purge/15 seconds alcohol/10 seconds purge. With ethyl alcohol as reactant the Cu surface does not get oxidized. No deposition on silcon dioxide surface was observed for this condition. FIG. 9 is a Transmission Electron Microscope (TEM) images of a dielectric surface after formation of Al$_2$O$_3$ film.

Example 3

Figure 10:
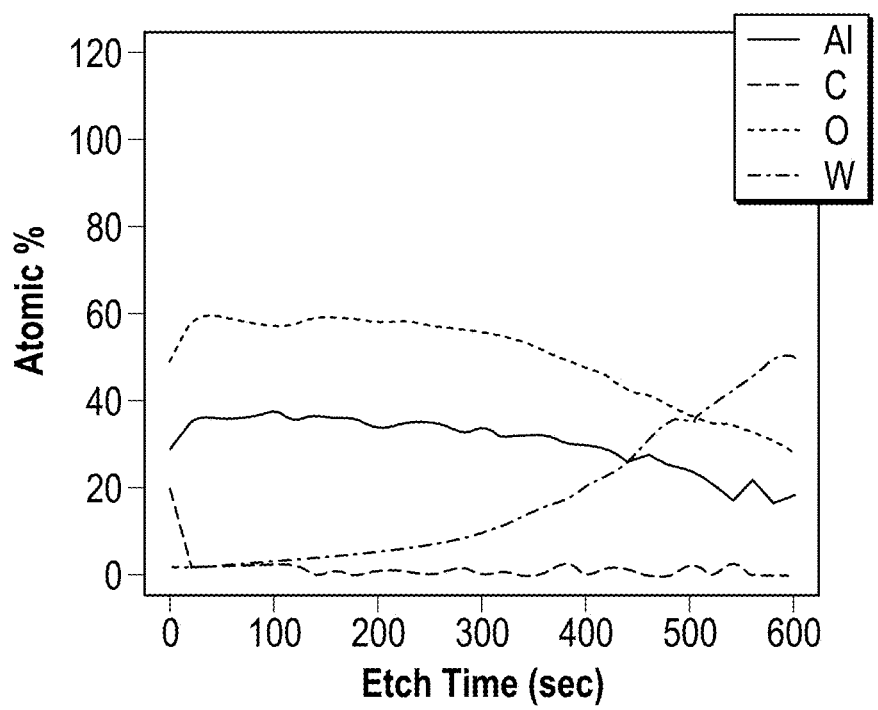
FIG. 10 is a graph of atomic % versus etch time for AlOx film selectively formed on tungsten at 390° C.
Figure 11:
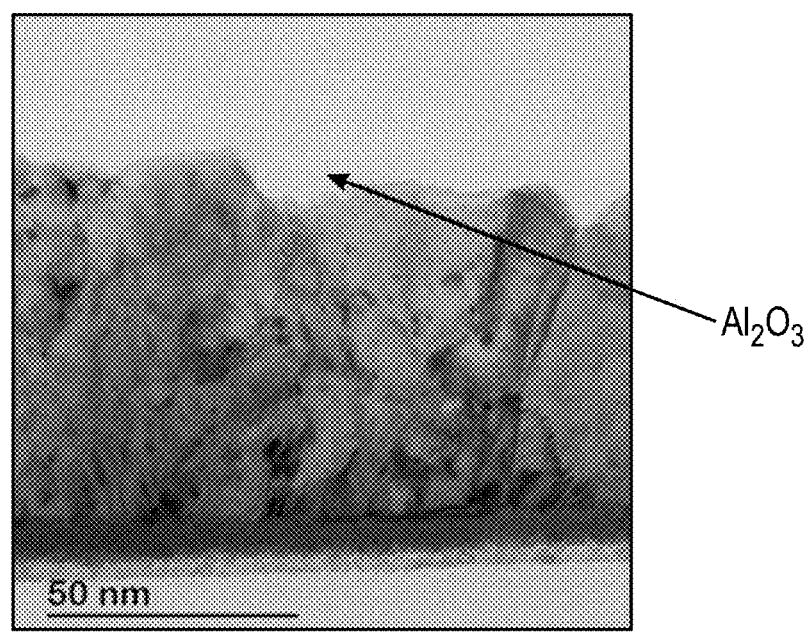
FIG. 11 is a Transmission Electron Microscope (TEM) image of a dielectric surface after formation of $Al_2O_3$ film on a tungsten surface.

AlOx layer was selectively deposited onto a tungsten surface in the presence of SiO$_2$ dielectric surface by an ALD process using dimethyl aluminum isopropoxide and ethyl alcohol at substrate temperatures of 250° C. and 390° C. The ALD process includes: 50 cycles, 5 torr chamber pressure, 5 seconds precursor/10 seconds purge/15 seconds alcohol/10 seconds purge. The W surface was not treated to remove oxides. With ethyl alcohol as reactant the W surface does not get further oxidized. FIG. 10 is a Transmission Electron Microscope (TEM) images of a dielectric surface after formation of Al$_2$O$_3$ film 390° C. At 390° C., 55A of Al$_2$O$_3$ film was deposited on W surface and 8 Å was formed on SiO$_2$ surface. At 390° C., Al$_2$O$_3$ film was deposited on W surface based on X-ray photoelectron spectroscopy (XPS) and energy-dispersive X-ray spectroscopy (EDX) data.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
positioning a substrate within a processing chamber, wherein the substrate comprises a metal surface and a dielectric surface;
exposing the substrate to a first process condition comprising an aluminum precursor gas comprising an isopropoxide based aluminum precursor;
exposing the substrate to a second process condition comprising an oxygen source reactant to selectively form an aluminum oxide (AlOx) etch stop layer onto the metal surface while leaving exposed the dielectric surface; and
optionally repeating exposure to the first process condition and the second process condition to form a desired thickness of the AlOx etch stop layer.

2. The processing method of claim 1, wherein the isopropoxide based aluminum precursor comprises dimethyl aluminum isopropoxide.

3. The processing method of claim 1, wherein the dielectric surface comprises silicon.

4. The processing method of claim 1, wherein the substrate is at a temperature of less than 400° C.

5. The processing method of claim 1, wherein the reactant is non-oxidizing to the metal surface.

6. The processing method of claim 5, wherein the reactant comprises an alcohol.

7. A processing method comprising:
positioning a substrate within a processing chamber, wherein the substrate comprises a copper or tungsten surface and a dielectric surface; and
exposing the substrate to a first process condition comprising an aluminum precursor gas comprising dimethyl aluminum isopropoxide;
exposing the substrate to a second process condition comprising an alcohol reactant to selectively form an aluminum oxide (AlOx) etch stop layer having a selectivity of at least about 5:1 onto the copper or tungsten surface while leaving exposed the dielectric surface; and optionally repeating exposure to the first process condition and the second process condition to form a desired thickness of the aluminum oxide etch stop layer.

8. The processing method of claim 7, wherein during the process a temperature of the substrate is 400° C. or less.

9. The processing method of claim 7, wherein the process is an atomic layer deposition (ALD) process.

10. The processing method of claim 7, further comprising forming a SiOC layer onto the AlOx etch stop layer.

11. The processing method of claim 7, wherein the alcohol comprises ethanol.

12. The processing method of claim 7, wherein the AlOx etch stop layer comprises less than 10% carbon on an atomic basis.

13. The processing method of claim 7, wherein the dielectric surface comprises silicon.

* * * * *